United States Patent [19]

Stephens, Jr.

[11] Patent Number: 5,386,385
[45] Date of Patent: Jan. 31, 1995

[54] METHOD AND APPARATUS FOR PREVENTING INVALID OPERATING MODES AND AN APPLICATION TO SYNCHRONOUS MEMORY DEVICES

[75] Inventor: Michael C. Stephens, Jr., Stafford, Tex.

[73] Assignee: Texas Instruments Inc., Dallas, Tex.

[21] Appl. No.: 189,538

[22] Filed: Jan. 31, 1994

[51] Int. Cl.⁶ .................. G11C 7/00; G06F 13/32
[52] U.S. Cl. .................. 365/189.05; 365/189.01; 365/195; 395/275; 395/725
[58] Field of Search ............. 365/189.05, 233, 189.01, 365/201, 222, 195; 395/275, 375, 725, 775

[56] References Cited

U.S. PATENT DOCUMENTS

| | | | |
|---|---|---|---|
| 4,799,198 | 1/1989 | Ogawa | 365/221 |
| 5,077,693 | 12/1991 | Hardee et al. | 365/230 |
| 5,083,296 | 1/1992 | Hara et al. | 365/230 |
| 5,224,070 | 6/1993 | Fandrich et al. | 365/201 |
| 5,239,505 | 8/1993 | Fazio et al. | 365/222 |
| 5,276,843 | 1/1994 | Tillinghast et al. | 365/222 |
| 5,289,584 | 2/1994 | Thome et al. | 365/219 |

OTHER PUBLICATIONS

Reese, Ed and Eddy Huang, *A Sub-10nS Cache SRAM for High Performance 32 Bit Microprocessors*, IEEE, 1990 Cust. IC confr., pp. 24.2.1–24.2.4.
Wilson, Ron, *Will the Search for the Ideal Memory Architecture Ever End?*, Computer Design, Jul. 1, 1990, pp. 78–99.
Hochstedler, Charles, *Self-Timed SRAMs Pace High-Speed ECL Processors*, Semiconductor Memories, 1990, pp. 4–10.
Lineback, J. Robert, *System Snags Shouldn't Slow the Boom in Fast Static RAMs*, Electronics, Jul. 23, 1987, pp. 60–62.
Triad Semiconductors Inc., *Static RAMs have on-chip address and Data Latches for Pipelining*, EDN, Dec. 8, 1988, p. 116.
Cole, Bernard C., *Motorola's Radical SRAM Design Speeds Systems 40%*, Electronics, Jul. 23, 1987, pp. 66–68.
Iqbal, Mohammmad Shakaib, *Internally timed RAMs Build Fast Writable Control Stores*, Electronic Design, Aug. 25, 1988, pp. 93–96.
Leibson, Steven, *SRAMs' On-Chip Address and data Ltches Boost Throughput in Pipelined Systems*, EDN, Oct. 13, 1988, pp. 102–103.
Gallant, John, *Special-feature SRAMs*, EDN, Jun. 20, 1991, pp. 104–112.
Weber, Samuel, *Specialty SRAMs Are Filling the Speed Gap*, Electronics, May 1990, pp. 85–87.

Primary Examiner—Eugene R. LaRoche
Assistant Examiner—Tan Nguyen
Attorney, Agent, or Firm—Richard B. Havill; Richard L. Donaldson

[57] ABSTRACT

A synchronous memory device is provided in which a timing and control circuit (28) receives timing and control inputs. A row address buffer (38) and row decoders (40 and 42) operate to enable rows in plural memory sections (30, 32, 34, and 36). Column decoders (58, 60, 62, and 64) operate to enable columns in each of the memory sections (respectively, 32, 36, 30 and 34). The column decoders (58, 60, 62, and 64) decode addresses received from counters (respectively 52, 54, 48, and 50), an adder (46), and a latch (56). Counters (48, 50, 52, and 54) and adder (46) generate column addresses for each memory section based on a starting address, thereby allowing for internal operation at less than the external system frequency. An operation mode register (29) stores mode data for controlling certain operations, and a state machine (130) operates to prevent indeterminate operation if invalid mode data is input to the operation mode register (29).

23 Claims, 5 Drawing Sheets

METHOD AND APPARATUS FOR PREVENTING INVALID OPERATING MODES AND AN APPLICATION TO SYNCHRONOUS MEMORY DEVICES

CROSS REFERENCES TO RELATED APPLICATIONS

This Application is related to the following copending Applications, all assigned to Texas Instruments Incorporated, and which are herein incorporated by reference: U.S. patent application Ser. No. 08/189,223, filed Jan. 31, 1994, entitled "A CLOCK CONTROL CIRCUIT ARRANGEMENT", Attorney Docket No. TI-18272; U.S. patent application Ser. No. 08/189345, filed Jan. 31, 1994, entitled "METHOD AND APPARATUS FOR SYNCHRONOUS MEMORY ACCESS WITH SEPARATE MEMORY BANKS AND WITH MEMORY BANKS DIVIDED INTO COLUMN INDEPENDENT SECTIONS", Attorney Docket No. 18275; U.S. patent application Ser. No. 08/189,527, filed Jan. 31, 1994, entitled "METHOD AND APPARATUS FOR WRITING DATA IN A SYNCHRONOUS MEMORY HAVING COLUMN INDEPENDENT SECTIONS AND A METHOD AND APPARATUS FOR PERFORMING WRITE MASK OPERATIONS", Attorney Docket No. TI-18278; U.S. patent application Ser. No. 08/189,371, filed Jan. 31, 1994, entitled "METHOD AND APPARATUS FOR RECONFIGURING A SYNCHRONOUS MEMORY DEVICE AS AN ASYNCHRONOUS MEMORY DEVICE", Attorney Docket No. TI-18276; U.S. patent application Ser. No. 08/189,539, filed Jan. 31, 1994, entitled "METHOD AND APPARATUS FOR PRODUCTION TESTING OF SELF-REFRESH OPERATIONS AND A PARTICULAR APPLICATION TO SYNCHRONOUS MEMORY DEVICES", Attorney Docket No. TI-18277.

TECHNICAL FIELD OF THE INVENTION

This invention relates generally to the field of electronic devices, and more particularly to a method and apparatus for preventing invalid operating modes and an application to synchronous memory devices.

BACKGROUND OF THE INVENTION

The basic architecture of most data processing systems today includes a digital processor and random access memory. For economic reasons, the random access memory ("RAM") is often dynamic random access memory ("DRAM").

Typical operating frequencies for asynchronous DRAMs are in the range of 33 Mhz. For system clock rates above this range, the DRAM becomes a bottleneck that forces the processor and other components to wait for memory access. The same problem exists for more expensive memories as well, such as static random access memory ("SRAM"), electrically erasable programmable read-only memory ("EEPROM"), other programmable read-only memory ("PROM"), and read-only memory ("ROM").

Recently, synchronous dynamic random access memories ("SDRAM") have been proposed to take better advantage of inherent DRAM bandwidth. With synchronous DRAMs, data is clocked in and out of the memory device at relatively high rates. Due to certain standardization agreements, synchronous DRAMs have only a few operating modes. These operating modes are typically controlled by an operation mode register. Such a register may be, for example, a 7-bit wide register. Although such a register allows for 128 operating modes, synchronous DRAMs operate in only a few modes, a number which is much less than 128. Thus, misprogramming of the operation mode register with an invalid operating mode can occur, resulting in indeterminate device operation.

Indeed, this problem exists in any integrated circuit where user programmable registers are employed to allow changing between operating modes, and where, for an n-bit register, less than $2^n$ operating modes are available.

The indeterminate device operation that results from entry of invalid operating modes is highly undesirable.

SUMMARY OF THE INVENTION

Therefore, a need has arisen for a method and apparatus for preventing operation in invalid operating modes, and in particular as applied to synchronous memory devices.

In accordance with the teachings of the present invention, a method and apparatus for preventing invalid operating modes, and a particular application to synchronous memory devices are provided which substantially eliminate or reduce disadvantages and problems associated with the prior systems.

In particular, a synchronous memory device for storing data is provided in which a timing and control circuit receives an address and control inputs, one of the control inputs being a system clock operating at a system frequency. A memory bank is included that is divided into a plurality of memory sections, each of the memory sections including an array of memory cells arranged in rows and columns. A row decoder is operable to enable rows in each of the memory sections, and a column decoder is operable to synchronously enable columns in each of the memory sections substantially simultaneously. An operation mode register is provided for storing operating modes for the memory device. A state machine is coupled to the operation mode register and decodes mode data stored in the operation mode register such that mode data corresponding to invalid operating modes is prevented from causing indeterminate operation of the memory device.

In a particular embodiment, the state machine includes a burst length state machine for decoding burst length data stored in the operation mode register and a read latency state machine operable to decode read latency data stored in the operation mode register.

In another particular embodiment, the state machine comprises an input decoder coupled to the operation mode register and a valid state latch coupled to the input decoder. The input decoder is operable to cause decoded data to be latched by the valid state latch only when mode data corresponding to valid operating modes is stored in the operation mode register. An output decoder is provided to decode data latched in the valid state latch.

Also disclosed is a circuit for preventing indeterminate operation of a device, which includes a mode register operable to store operating mode data for controlling a device. An input decoder is coupled to the mode register and to a valid state latch. The input decoder is operable to cause decoded data to be latched by the valid state latch only when mode data corresponding to valid operating modes is stored in the mode register. An output decoder circuit is provided for decoding data latched in the valid state latch.

A method is also provided for preventing indeterminate operation of a synchronous memory device, in which address and control inputs are received, one of the control inputs being a system clock operating at a system frequency. In response to the address and control inputs, predetermined rows in a plurality of memory sections are enabled. Furthermore, predetermined columns in each of the plurality of memory sections are synchronously enabled substantially simultaneously in response to the address and control inputs. Operating modes of the memory device are stored in an operation mode register, and mode data stored in the operation mode register is decoded such that invalid operating modes are prevented from causing indeterminate operation of the memory device.

A method is also provided for preventing indeterminate operation of a device, in which operating mode data for controlling a device is stored in a mode register. Mode data stored in the mode register is decoded, and decoded data is latched only when mode data corresponding to valid operating modes is stored in the mode register. Latched data is decoded for control of the device.

An important technical advantage of the present invention is the fact that misprogramming of a mode register is prevented from causing indeterminate operation of the device to be controlled. This advantage is achieved by decoding the mode data in the mode register such that decoded data is latched for control of the device only when mode data corresponding to valid operating modes is stored in the mode register.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

The present invention will be discussed in connection with a memory device, and in particular a synchronous DRAM embodiment. However, the concepts discussed herein apply as well to SRAM, EEPROM, PROM, ROM, and other memory devices, as well as devices generally that are controlled by mode registers.

Figure 1:
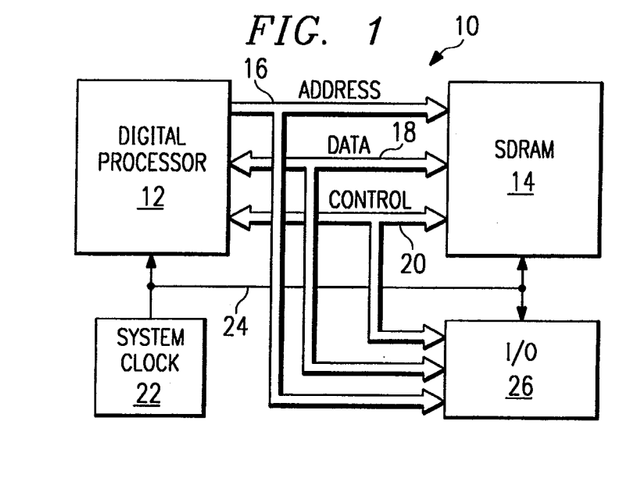
FIG. 1 illustrates a block diagram of a data processing system including a digital processor and synchronous DRAM.

FIG. 1 illustrates a block diagram of a data processing system 10. Data processing system 10 includes a digital processor 12 coupled to synchronous DRAM 14 through address bus 16, data bus 18, and control bus 20. System clock 22 is coupled to digital processor 12 and synchronous DRAM 14 through lead 24. Input/output ("I/O") device 26 is also coupled to digital processor 12 through buses 16, 18, and 20. I/O device 26 is also coupled to system clock 22 through lead 24. I/O device 26 may comprise, for example, a peripheral, such as a disk controller, or a device that allows communication with such a peripheral.

Data read from or written to synchronous DRAM 14 is transmitted across data bus 18. Reading and writing of data is controlled through control signals transmitted across control bus 20 and address locations transmitted across address bus 16. Typically, an address includes a row address and a column address. The address and control signals may be generated by digital processor 12 or by a memory controller. System clock 22 clocks the operation of digital processor 12 as well as synchronous DRAM 14. Address, data, and control signals, transmitted across buses 16, 18, and 20, respectively, are clocked into synchronous DRAM 14, and data is clocked out of synchronous DRAM 14. Therefore, the operation of synchronous DRAM 14 is synchronized with the system clock 22, and consequently with digital processor 12. It should be understood that the clock signal used to clock synchronous DRAM 14 may be derived from system clock 22. For example, digital processor 12 may output a clock signal that is derived from system clock 22 and which may be used to clock operation of synchronous DRAM 14.

The block diagram of FIG. 1 illustrates one possible configuration of a digital processor and a synchronous DRAM. With such a configuration, significant speed increases in memory access may be achieved over systems that use standard asynchronous DRAMs.

Figure 2:
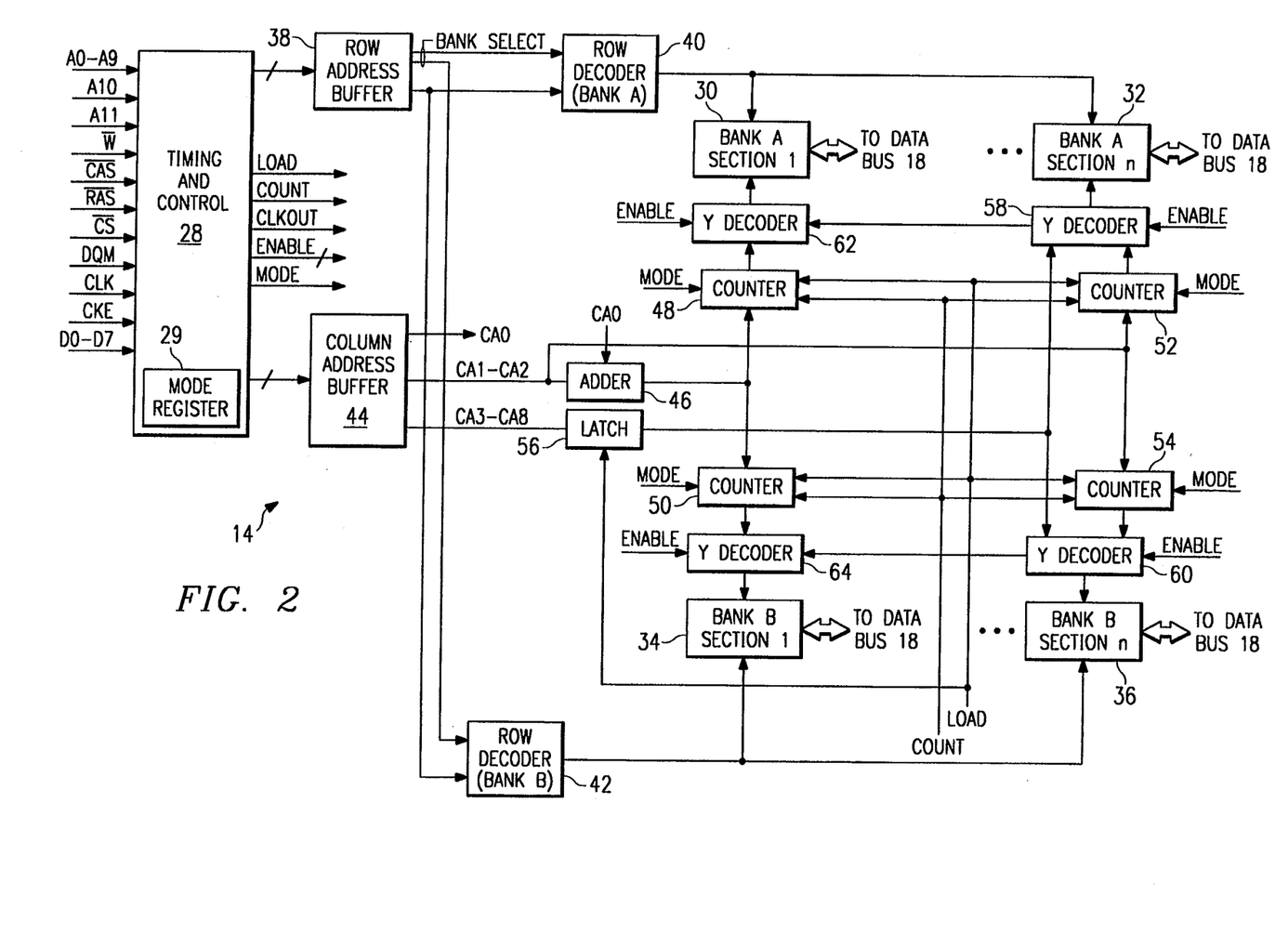
FIG. 2 illustrates a block diagram of a synchronous DRAM according to the teachings of the present invention.

FIG. 2 is a block diagram of synchronous DRAM 14 constructed according to the teachings of the present invention. Timing and control circuit 28 receives several inputs and generates several internal signals used to control and time the operation of synchronous DRAM 14. The inputs received by timing and control circuit 28 are listed in the following TABLE 1 and will be discussed in detail in connection with FIG. 2 and the remaining FIGUREs.

TABLE 1

| INPUT | DESCRIPTION |
| --- | --- |
| A0–A10 | Address Inputs |
| A11 | Bank Select |
| W | Write Enable |
| CAS | Column Address Strobe |
| RAS | Row Address Strobe |
| CS | Chip Select |
| DQM | Data/Output Enable |
| CLK | System Clock |
| CKE | Clock Enable |

TABLE 1-continued

| INPUT | DESCRIPTION |
| --- | --- |
| D0–D7 | Data Inputs/Outputs |

The input signal CLK is the system clock operating at a system frequency. The system frequency is the cycle rate of the CLK signal. It should be understood that the particular input signals listed in the table above are exemplary only, and other signals may be used without departing from the intended scope of the present invention. For example, 12 address inputs are shown, which allow for receiving time multiplexed row and column addresses. However, a different number of address lines may be used to allow row and column addresses to be received together. Also, more or less address lines may be used in connection with a memory device with more or less memory space, or with a differently arranged memory array. Similarly, although 8 data lines are shown, more or less data lines may be used without departing from the intended scope of the present invention.

The synchronous DRAM 14 may be advantageously operated in a burst mode. In the burst mode, data is written-in or read-out at bursts of specified lengths. Within each burst, data is accessed each clock cycle, thus providing for high-speed synchronous operation. In a particular embodiment, the length of each burst sequence may be 1, 2, 4, or 8 accesses, although longer bursts may also be used without departing from the present invention. Therefore, as an example, with a device that inputs or outputs 8 bits at a time (1 byte at a time), 1, 2, 4, or 8 bytes can be read or written in a burst. In such a burst, each byte follows the last byte with no clock delays in between.

During a burst operation, data may be read or written serially or interleaved. Serial and interleaved refer to the order in which logical address locations are accessed. The burst length and burst type (i.e., whether serial or interleaved) are user programmable and stored in a mode register 29 within timing and control circuit 28. In a particular embodiment, the burst length and burst type data may be received across the address lines after entering a programming mode.

The array of memory cells within synchronous DRAM 14 is divided into two banks, bank A and bank B, as shown in FIG. 2. Furthermore, each memory bank is divided into n memory sections. As shown in FIG. 2, bank A is divided into sections 30 through 32. Likewise, bank B is divided into sections 34 through 36. The present invention will be discussed in connection with an embodiment in which each memory bank is divided into two sections, it being understood, however, that each memory bank may be divided into many more sections.

Within bank A, the columns of section 30 are independent from the columns of section 32. Therefore, each section may be separately accessed. Thus, sections 30 and 32 are said to be "column independent." Similarly, sections 34 and 36 of bank B are column independent. In a particular embodiment, for example, each section contains 4,096 rows and 1,024 columns, with two rows in each section being addressed by one row address, and four columns in each section being addressed by one column address. Thus, in this particular example, 8 bits are accessed from each section for one row and one column address. In this embodiment, twelve address bits are used for the row addresses, with one of these twelve bits selecting the memory bank, and the other eleven bits selecting two rows in each section. Furthermore, nine address bits are used for the column addresses, with one of these nine bits selecting the memory section, and the other eight bits selecting four columns in a section.

By dividing memory banks into n column independent sections, synchronous DRAM 14 may be operated internally at 1/n of the external system frequency, thus providing a significant advantage, since higher speed internal operation is more complex and expensive. For example, by dividing bank A into sections 30 and 32, data can be read out of each section at one-half the external frequency, with data being output from synchronous DRAM 14 at the rate of the external system clock. This is accomplished by accessing one memory location from one section and simultaneously accessing the next location from the other section. Thus, for example, for an external system frequency of 100 Mhz, each section must only be operated at 50 Mhz when two sections are used.

For an access to synchronous DRAM 14, whether it be a read or a write, the row address is received on the address inputs A0–A11 and latched in row address buffer 38 upon activation of the $\overline{RAS}$ signal and the rising edge of the CLK signal in the correct mode. The outputs of row address buffer 38 are internal row addresses. As discussed above, the row and column addresses may be time multiplexed, and in a particular example, the row address is received first. A BANK SELECT signal, which may correspond to row address input A11, is used to select between memory banks, through activation of the row decoders 40 and 42. Row decoder 40 decodes row addresses for bank A and row decoder 42 decodes row addresses for bank B. The BANK SELECT signal is generated by timing and control circuit 28. In a particular embodiment, the BANK SELECT signal is generated in response to activation of the $\overline{RAS}$ input signal and row address input A11.

Row decoder 40 decodes row addresses for section 30 and section 32 of bank A, and thus enables rows in each memory section. Likewise, row decoder 42 decodes row addresses for sections 34 and 36 of bank B. In a particular embodiment, each section of a particular bank is logically identical, and the same rows of each section are decoded simultaneously. It should be understood that separate row decoders may be used for each section of a particular bank without departing from the intended scope of the present invention.

The following is a discussion of the circuitry that controls column operations for each column independent section of a particular memory bank. This column decoders circuitry is operable to synchronously enable columns in each of the memory sections substantially simultaneously. A column address buffer 44 latches the column address received on the address inputs upon activation of the $\overline{CAS}$ signal and the rising edge of the CLK signal in the correct mode. The outputs of column address buffer 44 are internal column addresses. The internal column address bits will be referred to as CA0–CAn. For the particular embodiment shown, in which each memory bank is divided into two sections, column address bit CA0 is used to select between sections 30 and 32 of bank A and sections 34 and 36 of bank B. In embodiments where more sections are used, then more of the column address inputs would be needed to select between sections. For example, in an embodiment with four sections, two column address bits, CA0 and CA1, would be used to select between each section.

The low order column address bits CA1 and CA2 are input to an adder 46. Adder 46 adds either 1 or 0 to these low order bits, depending on column address bit CA0. If CA0=1, then adder 46 adds 1. If CA0=0, then adder 46 adds 0. The output of adder 46 is coupled to the inputs of counters 48 and 50. Counter 48 is associated with section 30 of bank A, and counter 50 is associated with section 34 of bank B. The low order column address bits CA1 and CA2 are also coupled directly to counters 52 and 54. Counter 52 is associated with section 32 of bank A and counter 54 is associated with section 36 of bank B. In the particular embodiment being discussed, the low order column address bits that are input to counters 48, 50, 52, and 54 either directly or through adder 46, are column address bits CA1 and CA2. These two bits, along with column address bit CA0, allow for burst counts of up to 8. With the burst length sequences to be discussed in connection with Tables 2-4, no carry or overflow bits are needed from adder 46.

Counters 48-54 synchronously load initial column address data upon activation of a LOAD signal. The LOAD signal is output by timing and control circuit 28. Thereafter, counters 48-54 count in either serial or interleaved fashion, depending upon the status of the MODE signal input to each counter, which is based on the burst type status stored in mode register 29. Counting is synchronously controlled by the COUNT signal, which is based on the burst data stored in the mode register 29. When active, the COUNT signal operates at 1/n the external system frequency.

The higher order column address bits CA3-CA8 are input to latch 56 and latched upon activation of the LOAD signal. The output of latch 56 is coupled to column decoders 58 and 60. Column decoder 58 is associated with section 32 of bank A and column decoder 60 is associated with section 36 of bank B. Column decoder 58 is coupled to column decoder 62 associated with section 30 of bank A. Similarly, column decoder 60 is coupled to column decoder 64 associated with section 34 of bank B. Each column decoder 58-64 is coupled to an ENABLE signal.

Column decoder 58 is coupled to the output of counter 52. Similarly, column decoder 60 is coupled to the output of counter 54. Column decoder 62 is coupled to the output of counter 48. Similarly, column decoder 64 is coupled to the output of counter 50.

In operation of the particular embodiment being discussed, the BANK SELECT signal activates a particular bank. The following discussion is in connection with activation of bank A, it being understood that bank B operates similarly. Row decoder 40 decodes rows in both sections 30 and 32. Upon activation of $\overline{CAS}$ and the rising edge of the CLK signal, column address buffer 44 latches the column address. This column address is the starting address, and will be used to generate all the other column addresses needed to complete a burst operation. To achieve high speed operation, the present invention accesses the starting address from the memory section to which the starting address corresponds, and simultaneously accesses the next address of the burst from the other section. This process repeats until the burst is complete.

By performing simultaneous accesses to more than one section, delays associated with decoding column addresses are experienced in parallel, rather than serially, and thus the column access time for the simultaneous accesses are hidden. Such accesses are typically about 30 nanoseconds long. Furthermore, by having two memory banks, delays associated with precharging bit lines are avoided by accessing alternately between banks, since one bank can precharge while the other bank is being accessed.

The column address bits CA1 and CA2 are loaded into counter 52. Those two bits, incremented by 0 or 1 by adder 46, are loaded into counter 48. Column decoders 58 and 62 decode the appropriate columns in response to the addresses received through counters 48 and 52 and latch 56. To reduce redundant circuitry, column decoder 58 decodes the high order address bits received from latch 56 and generates decoded high order factors both for itself and for column decoder 62. These high order factors are transmitted from decoder 58 to decoder 62.

Thus, counter 52 loads initial address bits, and counter 48 loads the same bits incremented by 0 or 1 by adder 46. If the starting column address is in section 30 (i.e., CA0=0), the adder 46 will add 0, since the next location (i.e., CA0=1) is in section 32, and CA1 and CA2 are unchanged. If the starting column address is in section 32 (i.e., CA0=1), then adder 46 will add 1, since the next location (i.e., CA0=0) is in section 30, and CA and CA2 are incremented by one. These initial address bits are loaded into counters 52 and 48 upon activation of the LOAD signal, and then decoded by column decoders 58 and 62 along with the bits output by latch 56. Latch 56 latches bits CA3-CA8 upon activation of the LOAD signal. The first two addresses of a burst are accessed in this manner.

On the next internal clock cycle, the COUNT signal is activated and counters 48 and 52 count according to the status of the MODE signal, thus outputting incremented column addresses in synchronism with the internal clock frequency, allowing for access to the next two addresses of the burst. Depending on the MODE signal, counters 48 and 52 will count in either serial or interleaved fashion. Counting continues in synchronism with the internal clock frequency until the burst operation is completed. The ENABLE signal will enable each column decoder 58 and 62 during either a read or write operation. Once the burst operation is completed, the column decoders and row decoders will be disabled, allowing the memory sections to pre-charge for the next operation.

The logical memory space of sections 30 and 32 is arranged such that successive memory locations alternate between section 30 and 32. For serial access, memory locations are ordered according to this logical arrangement. For interleaved access, memory locations are still ordered alternately from section 30 to section 32 and back again, but according to an interleave routine. The following TABLES 2-4 illustrate the internal column addresses generated by the adder 46 and the counters 48 and 52 for burst lengths of 2, 4, and 8, to access memory locations. It should be understood that both memory sections 30 and 32 are accessed simultaneously, and thus the first and second locations are accessed at once, as are the third and fourth, fifth and sixth, and seventh and eighth locations.

TABLE 2

Sequences for Burst Length of 2

| | INTERNAL COLUMN ADDRESS CA0 | |
|---|---|---|
| | START | 2ND |
| Serial | 0 | 1 |
| | 1 | 0 |
| Interleave | 0 | 1 |
| | 1 | 0 |

TABLE 3

Sequences for Burst Length of 4

| | INTERNAL COLUMN ADDRESS CA1, CA0 | | | |
|---|---|---|---|---|
| | START | 2ND | 3RD | 4TH |
| Serial | 00 | 01 | 10 | 11 |
| | 01 | 10 | 11 | 00 |
| | 10 | 11 | 00 | 01 |
| | 11 | 00 | 01 | 10 |
| Interleave | 00 | 01 | 10 | 11 |
| | 01 | 00 | 11 | 10 |
| | 10 | 11 | 00 | 01 |
| | 11 | 10 | 01 | 00 |

TABLE 4

Sequences for Burst Length of 8

| | INTERNAL COLUMN ADDRESS CA2, CA1, CA0 | | | | | | | |
|---|---|---|---|---|---|---|---|---|
| | START | 2ND | 3RD | 4TH | 5TH | 6TH | 7TH | 8TH |
| Serial | 000 | 001 | 010 | 011 | 100 | 101 | 110 | 111 |
| | 001 | 010 | 011 | 100 | 101 | 110 | 111 | 000 |
| | 010 | 011 | 100 | 101 | 110 | 111 | 000 | 001 |
| | 011 | 100 | 101 | 110 | 111 | 000 | 001 | 010 |
| | 100 | 101 | 110 | 111 | 000 | 001 | 010 | 011 |
| | 101 | 110 | 111 | 000 | 001 | 010 | 011 | 100 |
| | 110 | 111 | 000 | 001 | 010 | 011 | 100 | 101 |
| | 111 | 000 | 001 | 010 | 011 | 100 | 101 | 110 |
| Interleave | 000 | 001 | 010 | 011 | 100 | 101 | 110 | 111 |
| | 001 | 000 | 011 | 010 | 101 | 100 | 111 | 110 |
| | 010 | 011 | 000 | 001 | 110 | 111 | 100 | 101 |
| | 011 | 010 | 001 | 000 | 111 | 110 | 101 | 100 |
| | 100 | 101 | 110 | 111 | 000 | 001 | 010 | 011 |
| | 101 | 100 | 111 | 110 | 001 | 000 | 011 | 010 |
| | 110 | 111 | 100 | 101 | 010 | 011 | 000 | 001 |
| | 111 | 110 | 101 | 100 | 011 | 010 | 001 | 000 |

As can be seen from these tables, data is ordered alternately between memory sections 30 and 32, regardless of burst type. The internal column address bits CA1 and CA2 shown in the tables are controlled by adder 46 and counters 48 and 52. The first two addresses accessed during any burst are determined by the start address and adder 46. All other addresses are determined by counters 48 and 52. The internal column address bit CA0 is used to determine which memory section contains the first accessed location of a burst operation. The counters 48-54 and adder 46 determine subsequent memory locations, and both sections are accessed simultaneously, Thus, CA0 is not changed until another burst operation is initiated. For clarity, the above TABLES 2-4 indicate CA0 changing, simply to illustrate the logical order of each accessed location.

In a particular embodiment, each column address accesses 8 bits, and 8 bits are output from each section each internal clock cycle. Thus, a total of 16 bits are output to the output buffers each internal clock cycle, which will be discussed.

The particular embodiment being discussed includes two sections for each memory bank. However, many more sections may be used as well. For an embodiment with n sections, n-1 adders would be included, with the nth memory section having no adder. The adders would add between 0 and 1 to the appropriate address bits, the results then being loaded into associated counters. Each of the n sections would have its own counter fed either directly from the appropriate column address lines or through an associated adder. The amount added by each adder would be determined by the starting address. For example, with the starting address in memory section x, with $1<x<n$, then adders associated with memory sections x to n−1 would add zero, and adders associated with memory sections 1 to x−1 would add one. Zero is always added by the adder associated with the memory section containing the starting address. With n memory sections, n addresses of a burst would be accessed upon the initial load and then on each succeeding count. FIG. 2 illustrates n memory sections through use of the ". . ." symbol between sections.

Figure 3:
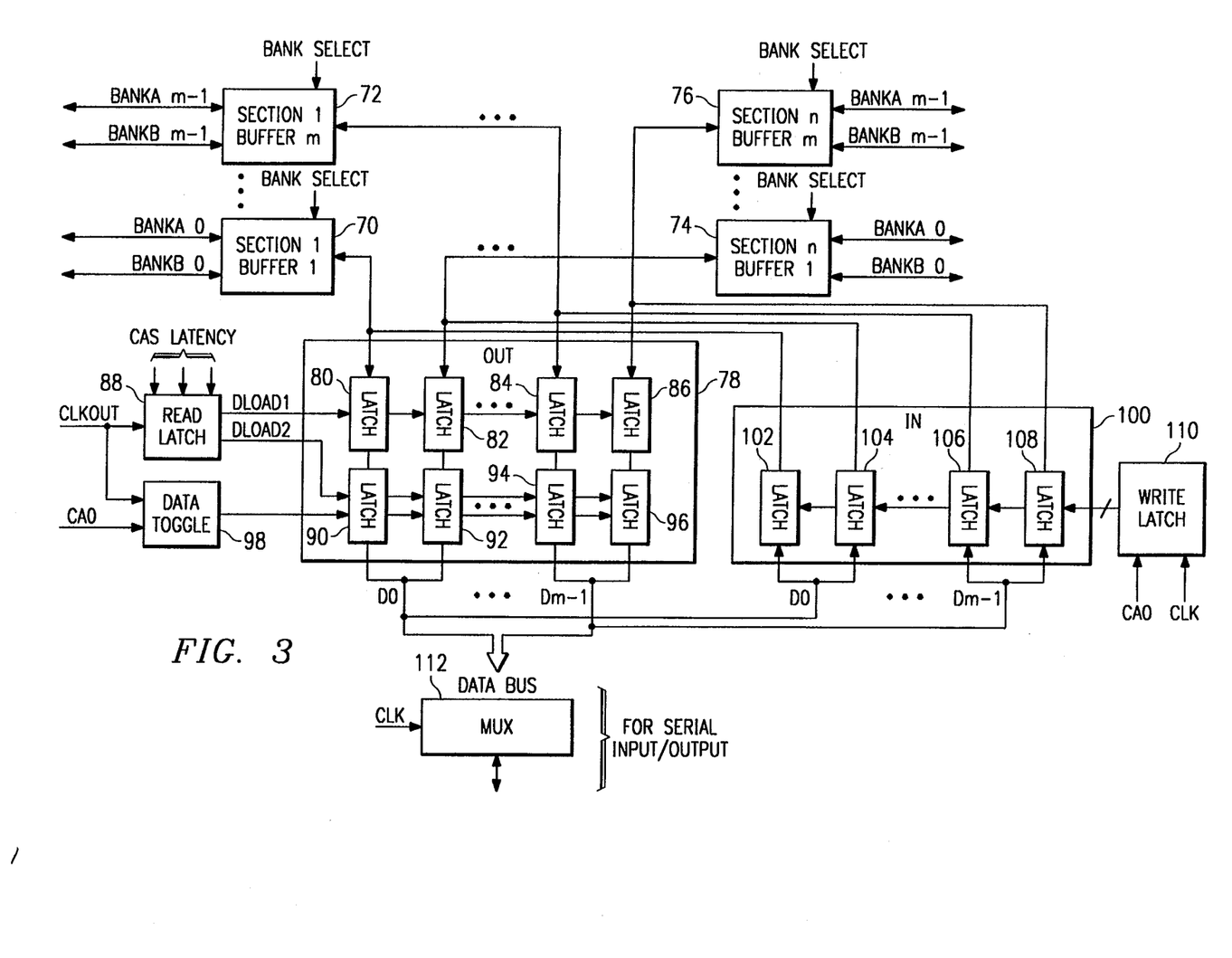
FIG. 3 illustrates I/O circuitry for a synchronous DRAM according to the teachings of the present invention.

FIG. 3 illustrates a block diagram of input/output circuitry for a synchronous DRAM constructed according to the teachings of the present invention. Each of the n sections into which the memory banks are divided include m buffers. Thus, buffers 70-72 are provided to receive output data and transmit input data to section 1 of banks A and B. Buffer 70 transmits internal data bit D0, while buffer 72 transmits data bit Dm-1, all for section 1. With respect to FIG. 2, buffers 70 and 72 would transmit data to and from sections 30 and 34 of banks A and B, respectively. Similarly, buffers 74 and 76 transmit data bits DO and Dm-1 to section n of banks A and B. In the particular embodiment discussed in connection to FIG. 2, buffers 74 and 76 transmit and receive data to and from sections 32 and 36 of banks A and B. For the embodiment in which more than two sections per bank are used, one set of buffers would be provided for each section. Buffers 70-76 select between banks through the use of the BANK SELECT signal.

Data to be read from synchronous DRAM 14 is output through output buffer 78. The output buffer 78 is operable to substantially simultaneously receive data from the memory sections of a bank and to alternately output data from the memory sections in synchronism with the system frequency. Output buffer 78 is a two stage buffer, which allows data to be read out at the external clock frequency. Data from each of the buffers 70-76 is latched into the first latch stage of output buffer 78. This first latch stage includes one latch for each of the buffers 70-76. Thus, for m bits and memory banks divided into n sections, there are m times n latches in the first stage of the output buffer 78. In the particular example being discussed, in which there are 8 bits and two sections per memory bank, the first stage of output buffer 78 includes 16 latches, latches 80-86. In particular, latch 80 receives data from buffer 70, and latch 82 receives data from buffer 74. Latch 84 receives data from buffer 72, and latch 86 receives data from buffer 76.

Data to be read out is latched into latches 80-86 upon a DLOAD1 signal. DLOAD1 is generated by read latch control circuit 88. Read latch control circuit 88 clocks data out based on a CLKOUT signal generated by timing and control circuit 28. The frequency of the CLKOUT signal is equal to that of the external system clock frequency. The DLOAD1 signal, when active, operates at ½ the external system clock frequency, for an embodiment with two sections per memory bank. The DLOAD1 signal is also generated based on CAS latency data which is stored as a code in mode register 29.

CAS latency is user programmable and determines the number of clock cycles that occur between assertion of the $\overline{CAS}$ signal and valid output data. Read latch circuit 88 also generates the DLOAD2 signal which latches data from the first latch stage of output buffer 78 into the second latch stage. The second latch stage of output buffer 78 includes latches 90-96. The second latch stage includes one latch per latch in the first stage.

A data toggle circuit 98 selects the order that the latches 90-96 will output data onto the output data lines. For the particular embodiment being discussed, in which each memory bank is divided into two sections, data toggle circuit 98 alternately selects between latches associated with each of the two sections. Thus, data toggle circuit 98 outputs its toggle signal based on the CLKOUT signal and a single input, bit CA0 of the column address. CA0 selects the order that the data from the two sections 30 and 32 of bank A and sections 34 and 36 of bank B will be output. Data toggle circuit 98 will cause the data in the second latch stage associated with each memory section to be alternately output. Once all the data has been output, the DLOAD2 signal will be asserted to load new data from the first latch stage. In the embodiment in which each memory bank is divided into more than two sections, then data toggle circuit 98 would receive sufficient input signals to select between each section for outputting data. Thus, the output buffer 78 receives data substantially simultaneously from each of the memory sections of a memory bank, and alternately outputs data from each of these memory sections in synchronism with the system frequency.

Data to be input to synchronous DRAM 14 is input through input buffer 100. Input buffer 100 includes latches 102-108. The number of latches in input buffer 100 is the same as the number of latches in either stage of output buffer 78. Write latch circuit 110 receives a clock signal at the system frequency and column address bit CA0 to choose which of the latches 102-108 receives the data being received on the data bus at a particular time.

A multiplexer 112 may also be included at the output stage to clock data in or out one bit at a time, in serial fashion, for appropriate applications, such as video applications.

Figure 4:
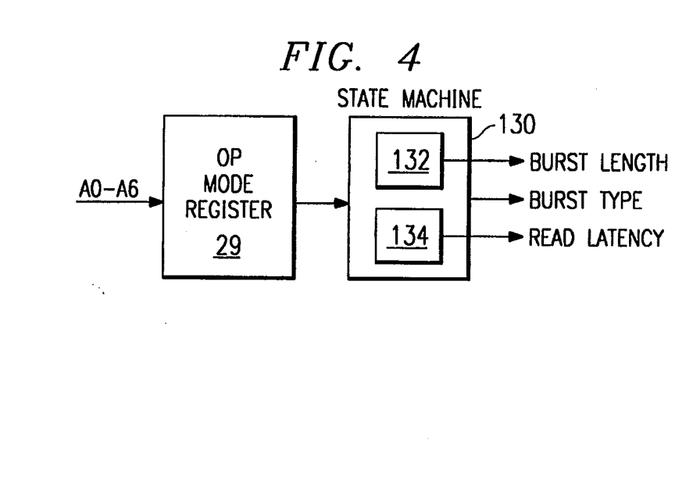
FIG. 4 illustrates a block diagram of an operation mode register and state machine according to the teachings of the present invention.

FIG. 4 illustrates a block diagram of circuitry for preventing indeterminate operation caused by programming of invalid operating modes into the operation mode register 29. As shown in FIG. 4, operation mode register 29 receives data on address lines A0–A6. In a particular example, operation mode register 29 is 7 bits wide. Operation mode register 29 is coupled to state machine 130. State machine 130 operates to decode and latch only valid operating modes, such that mode data corresponding to invalid operating modes will not result in indeterminate operation of the device. If invalid operating modes are programmed into operation mode register 29, then state machine 130 will not change states from the previous valid state.

State machine 130 includes a burst length state machine 132 and a read latency state machine 134.

The operation of state machine 130 will be discussed in connection with operation mode register 29 of synchronous DRAM 14 of FIGS. 1 and 2. It should be understood however that state machine 130 may be used in connection with any mode register and any integrated circuit. For example, state machine 130 can be used to prevent indeterminate operation resulting from invalid test modes programmed into test mode registers. Similarly, a circuit other than a synchronous DRAM, such as a microprocessor, which contains an operation mode register that could result in indeterminate operation if invalid operating modes are loaded into it, may also use state machine 130 without departing from the intended scope of the present invention.

Figure 5:
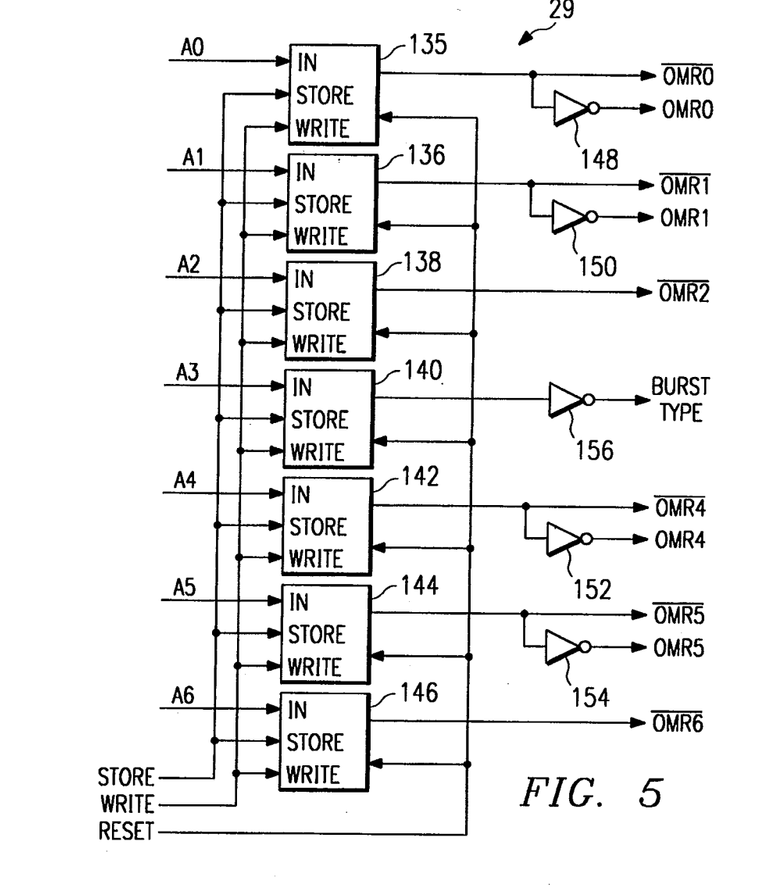
FIG. 5 illustrates a block diagram of an operation mode register according to the teachings of the present invention.

FIG. 5 illustrates particular circuitry for operation mode register 29. As shown in FIG. 5, latch circuits 135-146 are provided for latching in operation mode data received from address lines A0-A6. Mode data is stored in and output from latches 135-146 under control of the store and write signals shown in FIG. 5. The write signal opens the latches, and the store signal closes them. Furthermore, a reset signal is provided such that the latches 135-146 can be set to a known, valid operating state at particular times, such as at power-up. For the particular circuitry to be discussed in connection with the state machine, certain outputs are provided from latches 135-146. Latch 135 generates $\overline{OMR0}$ signal and the OMR0 signal through inverter 148. Similarly, latch 136 outputs the $\overline{OMR1}$ signal and the OMR1 signal through inverter 150. Latch 138 outputs the $\overline{OMR2}$ signal. Latch 142 outputs the OMR4 signal and the $\overline{OMR4}$ signal through inverter 152. Latch 144 generates the $\overline{OMR5}$ signal and the OMR5 signal through inverter 154. Latch 146 generates the $\overline{OMR6}$ signal. These signals will be discussed in connection with FIGS. 6 and 7. Latch 140 generates the burst type signal through inverter 156. The burst type signal corresponds to the MODE signal input to the counters 48–54 of FIG. 2.

As discussed above, operation mode register 29 can be used in connection with most any kind of integrated circuit having different operating modes. The particular example to be discussed is for an operation mode register used in connection with a synchronous DRAM. In a particular embodiment, the operation mode register 29 stores the burst length, the burst type, and read latency. The burst length is received on address lines A0, A1, and A2, and thus is stored in latches 135, 136, and 138. The burst type (whether access is serial or interleaved) is received on address line A3, and is stored in latch 140. The read latency mode is received on address lines A4, A5, and A6, and is stored in latches 142, 144, and 146.

Figure 6:
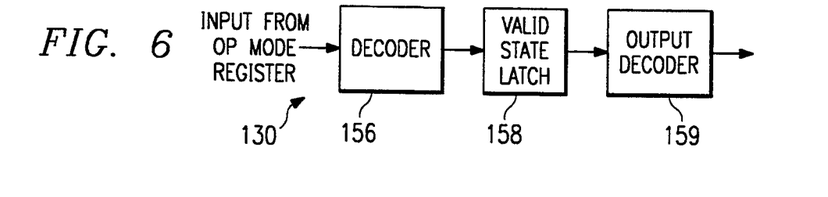
FIG. 6 illustrates a block diagram of a state machine constructed according to the teachings of the present invention.

FIG. 6 illustrates a block diagram of a state machine 130 constructed according to the teachings of the present invention. As shown in FIG. 6, decoder 156 receives input from the operation mode register 29. The output of decoder 156 is input to a valid state latch 158. The output of valid state latch 158 is coupled through output decoder circuit 159 to the circuit that is to be controlled by the operation mode register.

Decoder 156 operates such that mode data that has been programmed into the operation mode register 29 and which corresponds to valid operation modes is decoded and stored in valid state latch 158. Mode data that corresponds to invalid states is decoded by decoder 156 such that valid state latch 158 does not change states, and the previously latched valid state remains. Output decoder circuit 159 decodes the outputs of valid state latch 158 to generate the appropriate signals when used by the circuit controlled by the operation mode register.

Figure 7:
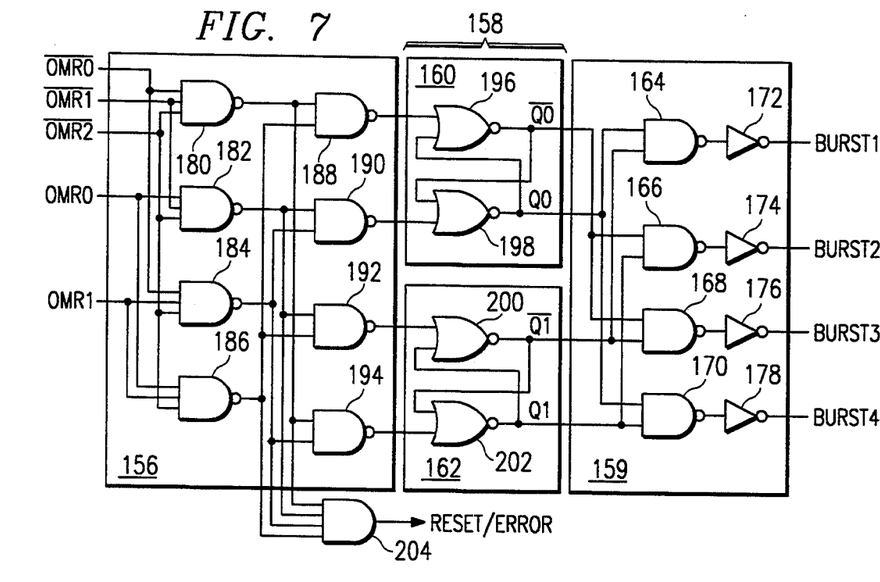
FIG. 7 illustrates circuitry for a burst length state machine according to the teachings of the present invention.
Figure 8:
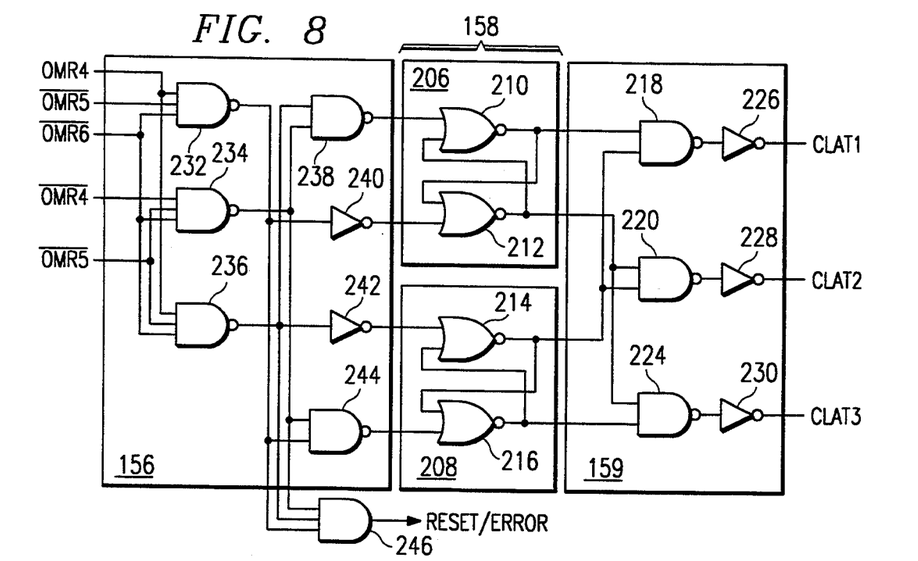
FIG. 8 illustrates circuitry for a read latency mode state machine according to the teachings of the present invention.

FIGS. 7 and 8 illustrate particular circuitry for state machines used to prevent indeterminate operation from invalid burst length and read latency modes. Because the burst type is only 1 bit, and two possible burst types are provided (i.e., serial or interleaved), no state machine latching is required for the burst type, since no invalid states can be entered.

FIG. 7 illustrates particular circuitry for the burst length state machine 132, which ensures that invalid burst length data will not result in indeterminate operation of the device. Burst length state machine 132 decodes the burst length mode data, as received on signals OMR0, $\overline{\text{OMR0}}$, OMR1, $\overline{\text{OMR1}}$, and OMR2. Burst length state machine 132 outputs four signals, burst 1, burst 2, burst 4, and burst 8. These signals indicate whether the burst length is 1, 2, 4, or 8, and control the COUNT signal of FIG. 2. The following TABLE 5 illustrates the valid mode register bits that correspond to burst lengths of 1, 2, 4, and 8.

TABLE 5

| BURST LENGTH | OP MODE REGISTER BITS 2,1,0 |
| --- | --- |
| 1 | 000 |
| 2 | 001 |
| 4 | 010 |
| 8 | 011 |

In a particular embodiment, proper operation will result with any one of the four burst 1, burst 2, burst 4, or burst 8 signals high, and the other three low. More than one of these signals high, or all of them low results in indeterminate operation. Thus, state machine 132 operates to ensure that only one of these signals is high at any one time. Valid states for the state machine 132 are latched by flip-flops 160 and 162. These flip-flops correspond to valid state latch 158 of FIG. 6. The outputs of these flip-flops are decoded through NAND-Gates 164–170 and inverters 172–178. This decoding circuitry corresponds to output decoder 159 of FIG. 6.

The signals input to burst length state machine 132 from operation mode register 29 are decoded by NAND-Gates 180–194. These NAND-Gates correspond to decoder 156 of FIG. 6. The outputs from operation mode register 29 corresponding to the burst length mode data are input to NAND-Gates 180–186 such that all of these NAND-Gates will output a high signal for invalid operating modes. For valid operating modes, only one of the NAND-Gates 180–186 will output a low signal, and the others will output high signals.

Therefore, for invalid operating modes, the inputs to the NAND-Gates 188–194 will all be high, resulting in NAND-Gates 188–194 outputting low signals, resulting in no change of the states latched by flip-flops 160 and 162. For valid modes, only one of the NAND-Gates 188–194 will output a high signal, thus changing the states of the flip-flops 160 or 162. Consequently, entry of invalid operation mode data into mode register 29 does not result in indeterminate operation of the circuit controlled by the operation mode register. Rather, the circuit continues operation in the previously entered valid mode.

In a particular embodiment, flip-flops 160 and 162 comprise two NOR-Gates each. In such an embodiment, flip-flop 160 includes NOR-Gates 196 and 198 coupled as shown in FIG. 6, while flip-flop 162 includes NOR-Gates 200 and 202 coupled as shown in FIG. 7.

Burst length state machine 132 may also include an AND-gate 204 whose inputs are coupled to the outputs of NAND-Gates 180–186. The output of AND-gate 204 will output a high signal upon entry of an invalid mode. This high signal may be used to reset operation mode register 29 to a known state or can be output as an error signal to indicate that invalid operating mode data has been entered into operation mode register 29.

FIG. 8 illustrates particular circuitry for a read latency state machine 134 according to the teachings of the present invention. Read latency state machine 134 ensures that invalid read latency data will not result in indeterminate operation of the device. The operation of read latency state machine 134 is similar to that of burst length state machine 132. In particular, read latency state machine 134 outputs three output signals, CLAT1, CLAT2, and CLAT3. These signals indicate whether the latency between the assertion of the $\overline{\text{CAS}}$ and valid output data is 1, 2, or 3 cycles, and correspond to those received by read latch control circuit 88 shown in FIG. 3. In a particular embodiment, only one of these signals will be high at any one time, and any more or less than one signals being high would result in indeterminate operation. The following TABLE 6 indicates the valid mode register bits that correspond to latencies of 1, 2, or 3 cycles.

TABLE 6

| CAS LATENCY | OP MODE REGISTER BITS 6,5,4 |
| --- | --- |
| 1 | 001 |
| 2 | 010 |
| 3 | 011 |

Valid states for read latency are stored in flip-flops 206 and 208, which correspond to valid state latch 158 of FIG. 6. In a particular embodiment, flip-flop 206 includes NOR-Gates 210 and 212, while flip-flop 208 includes NOR-Gates 214 and 216, coupled as shown in FIG. 8. The outputs of flip-flops 206 and 208 are decoded through NAND-Gates 218–224 and inverters 226–230. This decoding circuit, which corresponds to output decoder 159, results in appropriate outputs on CLAT1, CLAT2, and CLAT3.

The inputs to read latency state machine 134 are received from bits 4, 5, and 6 of operation mode register 29. In particular, the inputs to read latency state machine 134 are OMR4, $\overline{\text{OMR4}}$, OMR5, $\overline{\text{OMR5}}$, and OMR6. These signals are decoded through NAND-Gates 232, 234, and 236. The outputs from these NAND-Gates 232–236 are further decoded through NAND-Gate 238, inverter 240, inverter 242, and NAND-Gate 244. This decoding circuitry corresponds to decoder 156. Just as with the burst length state machine, invalid read latency data stored in operation mode register 29 results in the output of all of the NAND-Gates 232–236 being high, and thus the outputs of NAND-Gate 238, inverters 240 and 242, and NAND-Gate 244 being low. The inputs to flip-flops 206 and 208 will therefore also be low, and the flip-flops 206 and 208 will not change states.

For valid read latency data entered into operation mode register 29, the output of only one of the NAND-Gates 232, 234, and 236 will be a low signal. Consequently, flip-flops 206 or 208 will change states, based on the outputs of NAND-Gate 238, inverters 240 and 242, and NAND-Gate 244.

Therefore, entry of invalid operating mode data in the operation mode register 29 will not cause the flip-flops 206 or 208 to change states, and therefore the circuit controlled by the operation mode register will remain in its previously entered valid state. Entry of valid operating mode data will result in a change in the flip-flops 206 and 208 to another valid state.

An AND-gate 246 may be coupled to the outputs of NAND-Gates 232, 234, and 236 for outputting a high signal when invalid data has been entered into operation mode register 29. This high signal can be used to reset the operation mode register to a known state or to generate an error message.

Figure 9:
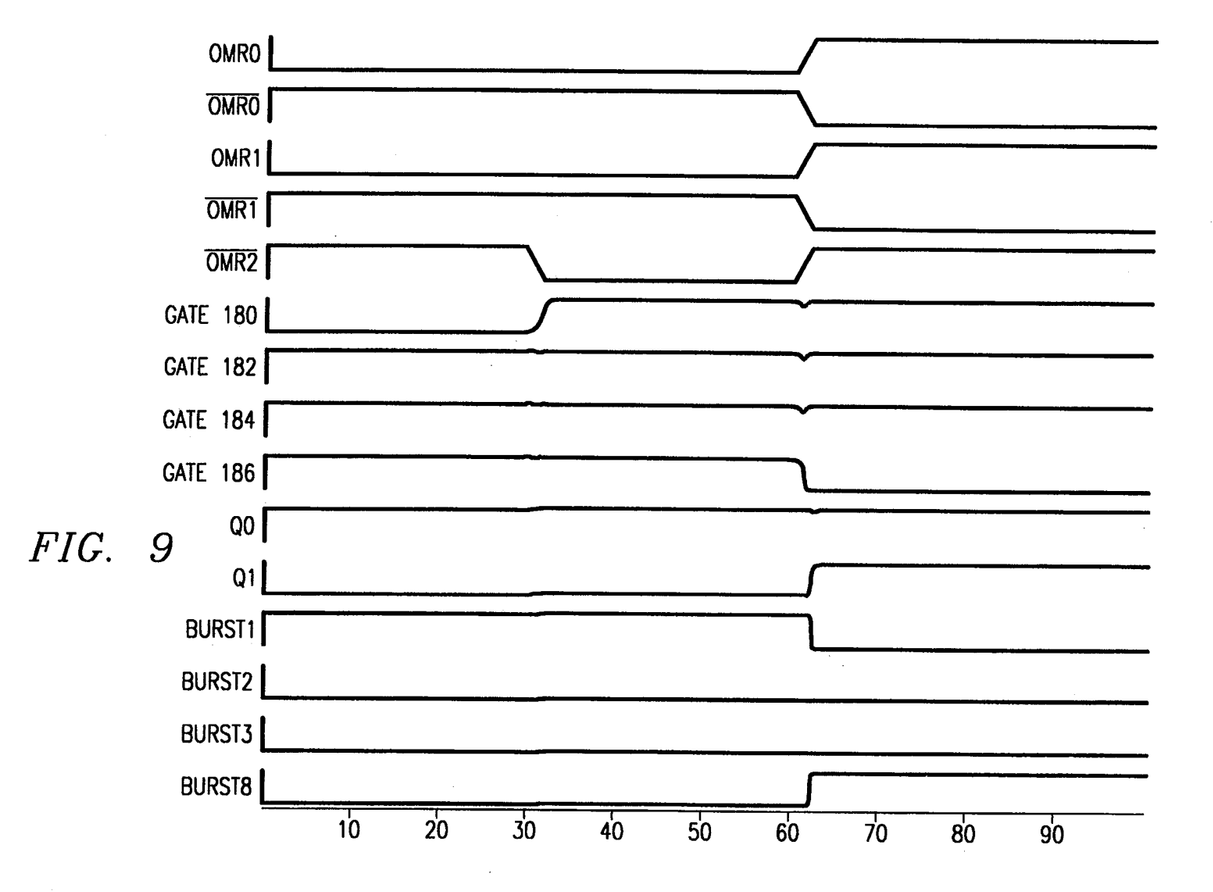
FIG. 9 is a timing diagram illustrating an example of operation of the burst length state machine according to the teachings of the present invention.

FIG. 9 illustrates a timing diagram of a particular example shown in the operation of the burst length state machine 132. Initially, a valid burst length of 1 has been entered. As can be seen, the burst 2, burst 4, and burst 8 signals are low, and the burst 1 signal is high. Furthermore, the outputs of NAND-Gates 182, 184, and 186 are high, while the output of NAND-Gate 180 is low. At time equals 30 nanoseconds, an invalid state is entered, represented by the $\overline{OMR2}$ signal going low. This invalid mode results in the output of NAND-Gate 180 going high, and the outputs of NAND-Gates 182–186 remaining high. Consequently, the states of the flip-flops 160 and 162 and the output signals do not change. At 60 nanoseconds, a valid state for a burst length of 8 is entered. This results in the output of NAND-Gate 186 going low, resulting in a change in the state of flip-flop 162 and the output signals. In particular, the burst 1, burst 2, and burst 3 signals are low, and the burst 8 signal goes high.

Particular circuitry has been disclosed for the operation mode register 29 and the state machine 130. This circuitry corresponds to a particular embodiment for use with a synchronous memory device. It should be understood that other circuitry can be used without departing from the intended scope of the present invention. For example, operation mode registers having more or less than 7 bits, and storing information for various operating modes will often be used, and may require different circuitry than that specifically described herein. It should be understood that such circuitry may be used without departing from the intended scope of the present invention. Furthermore, the specific circuitry disclosed herein, such as the NAND-Gates 180–186 and the flip-flops 160 and 162, is exemplary only, and other logical circuit elements can be used to perform the same function without departing from the intended scope herein. For example, flip-flops that do not change states when they receive logical ones, and corresponding decoder circuitry could also be used.

Although the present invention has been described in detail, it should be understood that various changes, substitutions, and alterations can be made without departing from the spirit and scope of the invention as defined by the appended claims.

What is claimed is:

1. A synchronous memory device for storing data, comprising:
    a timing and control circuit operable to receive address and control inputs and to generate internal control signals, one of said control inputs comprising a system clock operating at a system frequency;
    a memory bank including a plurality of memory sections, each of said memory sections including an array of memory cells arranged in rows and columns;
    a row decoder coupled to said timing and control circuit and operable to enable rows in each of said memory sections;
    a column decoder coupled to said timing and control circuit and operable to synchronously enable columns in each of said memory sections substantially simultaneously;
    an operation mode register operable to store mode data corresponding to operating modes for the memory device; and
    a state machine coupled to the operation mode register and operable to decode the mode data such that mode data corresponding to invalid operating modes is prevented from causing indeterminate operation of the memory device.

2. The synchronous memory of device of claim 1, wherein said memory bank comprises an array of dynamic random access memory cells.

3. The synchronous memory device of claim 1, wherein said memory bank includes two memory sections.

4. The synchronous memory device of claim 1, wherein said state machine comprises:
    a burst length state machine operable to decode burst length data stored in said operation mode register such that invalid burst length data is prevented from causing indeterminate operation of the memory device; and
    a read latency state machine operable to decode read latency data stored in said operation mode register such that invalid read latency data is prevented from causing indeterminate operation of the memory device.

5. The synchronous memory device of claim 1, wherein said mode data transmitted to said operation mode register across an address bus.

6. The synchronous memory device of claim 1, wherein said state machine comprises:
    an input decoder coupled to said operation mode register;
    a valid state latch coupled to said input decoder, said input decoder operable to cause decoded data to be latched by said valid state latch when mode data corresponding to valid operating modes is stored in said operation mode register; and
    an output decoder circuit operable to decode data latched in said valid state latch.

7. The synchronous memory device of claim 6, wherein:
    said valid state latch comprises a plurality of flip-flops; and
    said input decoder prevents said flip-flops from changing states when mode data corresponding to invalid operating modes is stored in said operation mode register.

8. The synchronous memory device of claim 6, and further comprising reset circuitry operable to reset said operation mode register to a known valid state when mode data corresponding to invalid operating modes is stored in said operation mode register.

9. The synchronous memory device of claim 6, and further comprising error message circuitry operable to generate an error message when mode data corresponding to invalid operating modes is stored in said operation mode register.

10. A circuit for preventing indeterminate operation of a device, comprising:
    a mode register operable to store mode data for controlling the device;
    an input decoder coupled to said mode register;

a valid state latch coupled to said input decoder, said input decoder operable to cause decoded data to be latched by said valid state latch when mode data corresponding to valid operating modes is stored in said mode register; and an output decoder circuit operable to decode data latched in said valid state latch.

11. The circuit of claim 10, wherein:

said valid state latch comprises a plurality of flip-flops; and said input decoder prevents said flip-flops from changing states when mode data corresponding to invalid operating modes is stored in said mode register.

12. The circuit of claim 10, and further comprising reset circuitry operable to reset said mode register to a known valid state when mode data corresponding to invalid states is stored in said mode register.

13. The circuit of claim 10, and further comprising error message circuitry operable to generate an error message when mode data corresponding to invalid states is stored in said mode register.

14. A method of preventing indeterminate operation of a synchronous memory device, comprising the steps of:

receiving address and control inputs, one of the control inputs comprising a system clock operating at a system frequency;

in response to the address and control inputs, enabling predetermined rows in a plurality of memory sections;

in response to the address and control inputs, synchronously enabling predetermined columns in each of the plurality of memory sections substantially simultaneously;

storing mode data corresponding to operating modes for the memory device in an operation mode register; and decoding the mode data such that mode data corresponding to invalid operating modes is prevented from causing indeterminate operation of the memory device.

15. The method of claim 14, wherein said step of decoding data comprises:

decoding burst length data stored in the operation mode register such that invalid burst length data is prevented from causing indeterminate operation of the memory device; and decoding read latency data stored in the operation mode register such that invalid read latency data is prevented from causing indeterminate operation of the memory device.

16. The method of claim 14, wherein said step of decoding data comprises:

decoding the mode data stored in the operation mode register;

latching decoded data when mode data corresponding to valid operating modes is stored in the operation mode register; and decoding latched data for control of the memory device.

17. The method of claim 16, wherein said step of decoding the mode data comprises preventing a plurality of flip-flops from changing states when mode data corresponding to invalid operating modes is stored in the operation mode register.

18. The method of claim 16, and further comprising the step of resetting the operation mode register to a known valid state when mode data corresponding to invalid operating modes is stored in the operation mode register.

19. The method of claim 16, and further comprising the step of generating an error message when mode data corresponding to invalid operating modes is stored in the operation mode register.

20. A method of preventing indeterminate operation of a device, comprising the steps of:

storing mode data for controlling the device in a mode register;

decoding the mode data stored in the mode register;

latching decoded data when mode data corresponding to valid operating modes is stored in the mode register; and decoding latched data for control of the device.

21. The method of claim 20, wherein said step of decoding the mode data comprises preventing a plurality of flip-flops from changing states when mode data corresponding to invalid operating modes is stored in the mode register.

22. The method of claim 2, and further comprising the step of resetting the mode register to a known valid state when mode data corresponding to invalid operating modes is stored in the mode register.

23. The method of claim 20, and further comprising the step of generating an error message when mode data corresponding to invalid operating modes is stored in the mode register.

* * * * *